(12) United States Patent
Dutra et al.

(10) Patent No.: US 7,437,701 B1
(45) Date of Patent: Oct. 14, 2008

(54) SIMULATION OF A PROGRAMMING LANGUAGE SPECIFICATION OF A CIRCUIT DESIGN

(75) Inventors: Paulo Luis Dutra, San Jose, CA (US); Jorge Ernesto Carrillo, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 329 days.

(21) Appl. No.: 11/487,898

(22) Filed: Jul. 17, 2006

(51) Int. Cl.
*G06F 17/50* (2006.01)
(52) U.S. Cl. .................................. 716/18
(58) Field of Classification Search .......... 716/18
See application file for complete search history.

(56) References Cited

U.S. PATENT DOCUMENTS

| | | | | |
|---|---|---|---|---|
| 6,182,258 | B1 * | 1/2001 | Hollander ............ | 714/739 |
| 6,233,540 | B1 * | 5/2001 | Schaumont et al. ...... | 703/14 |
| 7,257,802 | B2 * | 8/2007 | Daw et al. ............. | 716/18 |

OTHER PUBLICATIONS

U.S. Appl. No. 10/930,430, filed Aug. 31, 2004, Ganesan et al.

* cited by examiner

*Primary Examiner*—Jack Chiang
*Assistant Examiner*—Brandon W Bowers
(74) *Attorney, Agent, or Firm*—LeRoy D. Maunu

(57) ABSTRACT

Various approaches for simulating a circuit design are disclosed. In one approach, a first specification of a testbench and a second specification of the circuit design are generated in a hardware description language. The circuit design is synchronous to at least one clock signal. The second specification of the circuit design is automatically translated into a third specification in a general-purpose programming language, and the third specification specifies the behavior of the circuit design at transitions of the at least one clock signal. A fourth specification of an interface between the first specification of the testbench and the third specification of the circuit design is automatically generated. A first behavior of the circuit design is simulated using the first and third specifications linked by the fourth specification and the stimuli from the test bench.

20 Claims, 5 Drawing Sheets

SIMULATION OF A PROGRAMMING LANGUAGE SPECIFICATION OF A CIRCUIT DESIGN

FIELD OF THE INVENTION

The present invention generally relates to simulation of circuit designs.

BACKGROUND

The operation of a circuit design of an electronic system may be predicted by simulation. A simulation of a circuit design may be used to predict the operation of the circuit design prior to implementing the system in hardware. The simulation may predict the operation from a description of the circuit design in a hardware description language (HDL), and the simulation may provide a time sequence of values for every output and every internal signal of the circuit design when given a particular time sequence of values of stimuli for the inputs of the circuit design. The response of the circuit design may be predicted for various input scenarios by respective simulations.

During the development of a circuit design, a designer may examine the predicted operation provided by simulations of various scenarios to discover unintended behavior. Unintended behavior is typically exposed by a symptom that occurs somewhat later in simulation time than the cause of the unintended behavior. A designer may use the signal values generated by the logic simulation to trace backwards in simulation time from the symptom of a defect to the cause of a defect.

Simulation is invaluable to discover and fix defects in a circuit design prior to implementing the circuit design in hardware. Execution speed is an important characteristic of a simulation because execution speed may determine how long a designer has to wait for the results for a scenario. The execution speed may also limit the number scenarios that may be attempted. Another important characteristic of a simulation is accuracy in predicting the actual behavior exhibited when the circuit design is implemented in hardware.

The present invention may address one or more of the above issues.

SUMMARY OF THE INVENTION

The invention provides various embodiments for simulating a circuit design. In one embodiment, a first specification of a testbench and a second specification of the circuit design are generated in a hardware description language. The circuit design is synchronous to at least one clock signal. The second specification of the circuit design is automatically translated into a third specification in a general-purpose programming language, and the third specification specifies the behavior of the circuit design at transitions of the at least one clock signal. A fourth specification of an interface between the first specification of the testbench and the third specification of the circuit design is automatically generated. A first behavior of the circuit design is simulated using the first and third specifications linked by the fourth specification and the stimuli from the test bench.

In another embodiment, an apparatus is provided for simulating a circuit design. The apparatus includes means for generating a first specification of a testbench in a hardware description language, wherein the testbench generates stimuli for application to the circuit design; means for generating a second specification of the circuit design in the hardware description language, wherein the circuit design is synchronous to at least one clock signal; means for automatically translating the second specification of the circuit design into a third specification in a general-purpose programming language, wherein the third specification specifies the behavior of the circuit design at transitions of the at least one clock signal; means for automatically generating a fourth specification of an interface between the first specification of the testbench in the hardware description language and the third specification of the circuit design in the general-purpose programming language; and means for simulating a first behavior of the circuit design responsive to the stimuli from the testbench using the first and third specifications linked by the fourth specification.

Another embodiment provides an article of manufacture that includes a processor-readable device configured with instructions for simulating a circuit design. Execution of the instructions by one or more processors causes the one or more processors to perform operations including, generating a first specification of a testbench in a hardware description language, wherein the testbench generates stimuli for application to the circuit design; generating a second specification of the circuit design in the hardware description language, wherein the circuit design is synchronous to at least one clock signal; automatically translating the second specification of the circuit design into a third specification in a general-purpose programming language, wherein the third specification specifies the behavior of the circuit design at transitions of the at least one clock signal; automatically generating a fourth specification of an interface between the first specification of the testbench in the hardware description language and the third specification of the circuit design in the general-purpose programming language; and simulating a first behavior of the circuit design responsive to the stimuli from the testbench using the first and third specifications linked by the fourth specification.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
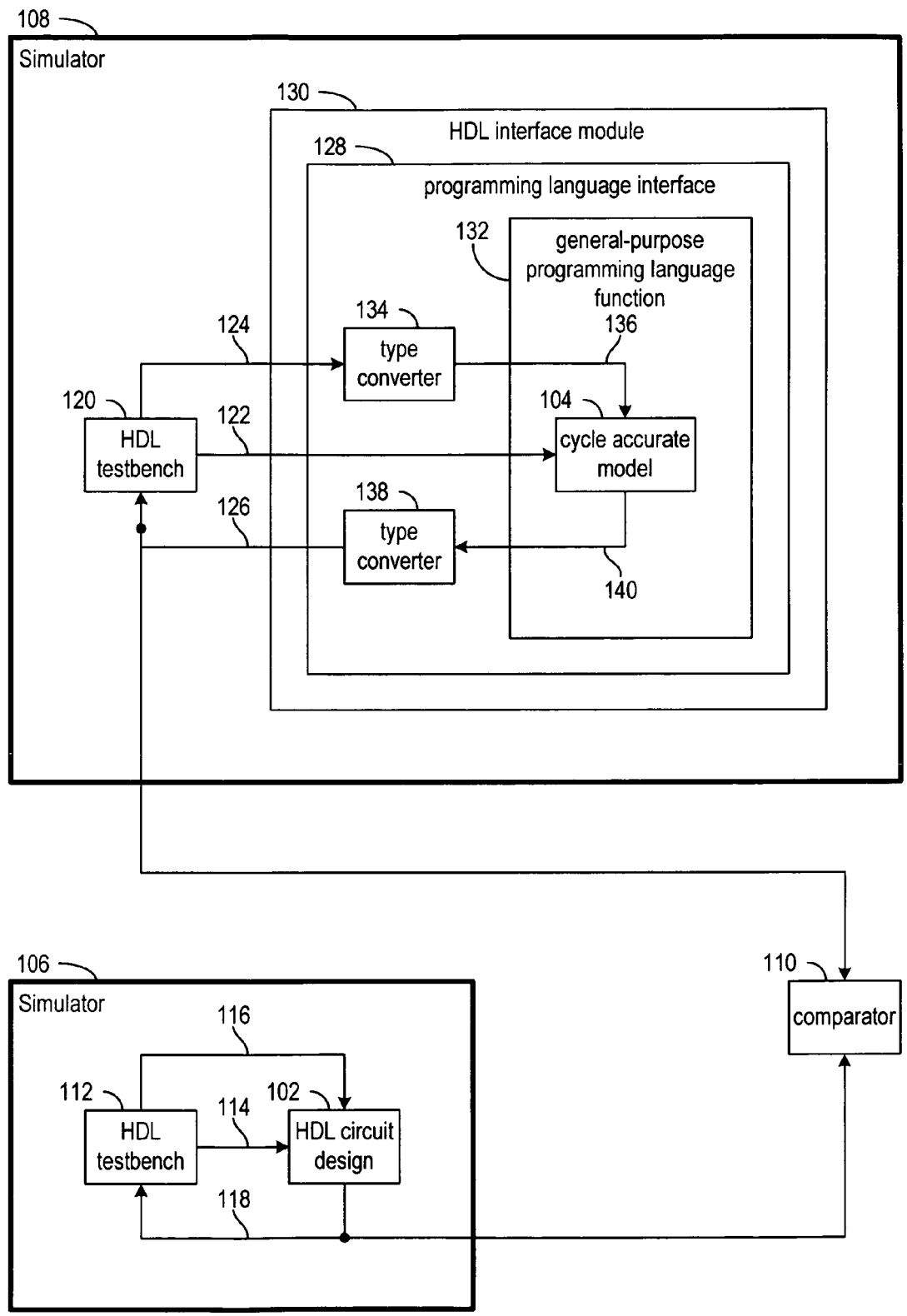
FIG. 1 is a block diagram of a system for simulating a circuit design using a general purpose programming language in accordance with various embodiments of the invention.

FIG. 1 is a block diagram of a system for simulating a circuit design using a general purpose programming language in accordance with various embodiments of the invention. The circuit design may be specified in a hardware description language (HDL) by a circuit design 102, and to provide a faster speed for simulation, the HDL circuit design 102 may be translated into a cycle accurate model 104 in a general purpose programming language. Simulators 106 and 108 may respectively simulate the HDL circuit design 102 and the cycle accurate model 104, and comparator 110 may compare the results from these simulations to verify that the cycle accurate model 104 is a proper translation that correctly reflects the behavior of the HDL circuit design 102. Co pending patent application Ser. No. 10/930,430, entitled "Generating Fast Logic Simulation Models for a PLD Design Description", filed Aug. 31, 2004, by Satish R. Ganesan, et. al., which is herein incorporated by reference, describes an example of the generation of a clock accurate simulation model, e.g., cycle accurate model 104, from a circuit design description, e.g., HDL circuit design 102.

The operation of HDL circuit design 102 may be verified by generating an HDL testbench 112 and simulating the combination of HDL testbench 112 and HDL circuit design 102 in simulator 106. The HDL testbench 112 may provide one or more clock signals on line 114 to the HDL circuit design 102, and the HDL testbench 112 may also drive the inputs on line 116 of the HDL circuit design 102. In certain embodiments, the HDL testbench 112 may receive and check the outputs on line 118 from the HDL circuit design 102. The HDL testbench 112 may be able to detect certain errors, such as violations of a protocol for the outputs on line 118 or unexpected or incorrect transactions from the HLD circuit design 102. The HDL testbench 112 may notify a user of the simulator 106 when an error is detected in the outputs on line 118 from the HDL circuit design 102.

While the simulator 106 may be useful for verifying the HDL circuit design 102, simulations using simulator 106 may have a slow simulation speed, and consequently an excessive amount of time may be required to sufficiently test the HDL circuit design 102 and also a limited amount of simulation of HDL circuit design 102 may be performed during a given time period. To increase the speed of simulation, the HDL circuit design 102 may be translated into a cycle accurate model 104 and the behavior of the HDL circuit design 102 may then be simulated by cycle accurate model 104 in simulator 108.

In certain cases, the translation of HDL circuit design 102 may create a cycle accurate model 104 that does not properly model the behavior of the HDL circuit design 102. For example, software that translates the HDL circuit design 102 into cycle accurate model 104 may be defective such that the model 104 does not actually reflect the behavior the HDL circuit design 102. For another example, HDL circuit design 102 may include elements of the hardware description language that cannot be successfully translated, such that model 104 cannot be generated or is generated in a manner that incorrectly expresses the behavior of HDL circuit design 102. In one embodiment, the translation software supports a "synthesizable" subset of the HDL, and an HDL circuit design 102, which includes elements of the HDL outside of the synthesizable subset, may be improperly translated. Example synthesizable subsets are the subsets the Verilog and VHDL hardware description languages that are synthesizable by the Xilinx Synthesis Technology (XST) synthesis tool available from Xilinx, Inc.

Various embodiments of the invention provide systems and methods for verifying that the behavior of a cycle accurate model 104 matches the corresponding HDL circuit design 102. The HDL testbench 112 of simulator 106 may produce a clock on line 114 and test inputs on line 116, and an identical HDL testbench 120 of simulator 108 may similarly produce a clock on line 122 and test inputs on line 124. Because the HDL testbenches 112 and 120 are essentially identical and may generate the same input values, the HDL circuit design 102 and the cycle accurate model 104 should generate matching output values on lines 118 and 126, respectively. The HDL testbench 112 (and 120) may be capable of generating various test scenarios, and comparator 110 may check for matching outputs on lines 118 and 126 from simulators 106 and 108 for each of these scenarios. It will be appreciated that the comparator 110 may check for additional matches between simulators 106 and 108, for example, the value of each register at each associated clock transition may be checked between simulators 106 and 108.

Because the HDL testbenches 112 and 120 are essentially the same, a single testbench specification may be used in both simulators 106 and 108. Thus, when HDL testbench 112 has already been created for simulator 106, the behavior of cycle accurate model 104 may be verified to match HDL circuit design 102 without creating another testbench through reuse of HDL testbench 112 as HDL testbench 120 in simulator 108. In contrast, existing processes may require development of another testbench specified in the general purpose programming language of the cycle accurate model 104. Because another testbench may operate differently than HDL testbench 112, it may be time consuming and expensive to use another testbench to verify matching behavior between design 102 and model 104.

Rather than fully modeling each signal of the HDL circuit design 102, the cycle accurate model 104 may be an abstraction that models the behavior of the registers and outputs of the HDL circuit design 102 at transitions of one or more clock signals on line 122. This abstraction of the HDL circuit design 102 by cycle accurate model 104 may contribute efficiencies resulting in a faster simulation speed for cycle accurate model 104. In addition, the values of inputs, registers, and outputs of cycle accurate model 104 may have a compact representation that contributes efficiencies resulting in the faster simulation speed for cycle accurate model 104. Each register of cycle accurate model 104 may be compactly represented by a single bit of an integer data type of the general purpose programming language, while each signal of HDL circuit design 102 may be represented by a state requiring multiple bits. For example, Verilog maintains two bits per signal for four states defined as "0", "1", "X" (unknown), and "Z" (high-impedance), and VHDL maintains three bits per signal for nine states defined as "U" (uninitialized), "X" (unknown), "0", "1", "Z" (high-impedance), "W" (weak unknown), "L" (weak 0), "H" (weak 1) and "–" (don't care).

Because the HDL testbench 120 and the cycle accurate model 104 are respectively specified in a hardware description language and a general purpose programming language, programming language interface 128 is used to connect the HDL testbench 120 to the cycle accurate model 104 in simulator 108. Examples for programming language interface 128 include the Programming Language Interface (PLI) of Verilog IEEE 1364, the Direct Programming Interface (DPI) of System Verilog, and the Foreign Language Interface (FLI) of ModelSim's VHDL simulator. HDL interface module 130 may use the programming language interface 128 to invoke type converters 134 and 138. In addition, the HDL interface module 130 may invoke a function 132 in the general purpose programming language at specified transitions of the clock or clocks on line 122. The specified transitions may reflect a sensitivity of the HDL circuit design 102 to the clock or clocks on line 114.

Because the HDL testbench 120 and the cycle accurate model 104 have different representations for the inputs of cycle accurate model 104, type converter 134 may convert between the representation of the inputs in HDL on line 124 and the representation of the inputs in the general purpose programming language on line 136. Similarly, type converter 138 may convert between the representation of the outputs of the cycle accurate model 104 in the general purpose programming language on line 140 and the representation of the outputs in HDL on line 126.

The comparator 110 may compare the results from simulators 106 and 108 for many test scenarios generated from identical HDL testbenches 112 and 120. Verification that the behavior of the cycle accurate model 104 matches the HDL circuit design 102 may be improved by increasing the number of test scenarios generated by HDL testbenches 112 and 120. Because a defect in the translation software may be detected by similar testing for other HDL circuit designs, verification that the behavior of the cycle accurate model 104 matches the HDL circuit design 102 also may be improved by testing the translation of many HDL circuit designs. A collection of HDL circuit designs and corresponding HDL testbenches may be available, and each HDL circuit design may be translated into a cycle accurate model that is compared against the corresponding HDL circuit design. In one example, a library includes thousands of HDL circuit designs and HDL testbenches with each HDL circuit design tested fairly exhaustively by the corresponding HDL testbench. After completing the comparison by comparator 110 of the outputs for each HDL circuit design in the library, the translation tools may be generally determined to correctly translate any HDL circuit design into a corresponding cycle accurate model.

Because the purpose of the cycle accurate model 104 is to increase the speed of simulation as compared to HDL circuit design 102, the purpose of cycle accurate model 104 would be defeated if each test scenario simulated on simulator 108 is also simulated on simulator 106. Thus, after the translation software is generally determined to correctly translate HDL circuit designs to corresponding cycle accurate models, test scenarios for a particular HDL circuit design 102 may usually be simulated only on the corresponding cycle accurate model 104.

In one embodiment, the HDL testbench 120 may check for certain errors at the outputs on line 126 from the cycle accurate model 104. The detection of an error by testbench 120 may indicate a defect in the original HDL circuit design 102 that is reflected in the cycle accurate model 104, or the error may indicate the translation has introduced a defect into the cycle accurate model 104. While test scenarios might not generally be simulated on simulator 106, after the detection of an error in simulator 108 for a particular test scenario, the particular test scenario may also be simulated on simulator 106 and the results from simulators 106 and 108 may be compared by comparator 110. If the comparator 110 finds a mismatch, the translation between the HDL circuit design 102 and the cycle accurate model 104 may be defective. If the comparator 110 finds a match, the defect may be in the HDL circuit design 102 and/or the HDL testbench 112.

After localizing and fixing a defect in the HDL circuit design 102 or the translation software the generates the cycle accurate model 104 from the HDL circuit design 102, the cycle accurate model 104 may be regenerated from the HDL circuit design 102 and simulation of test scenarios on simulator 108 may resume. Simulation may be completed when each test scenario passes without an error on simulator 108 for one or more HDL circuit designs.

Figure 2:
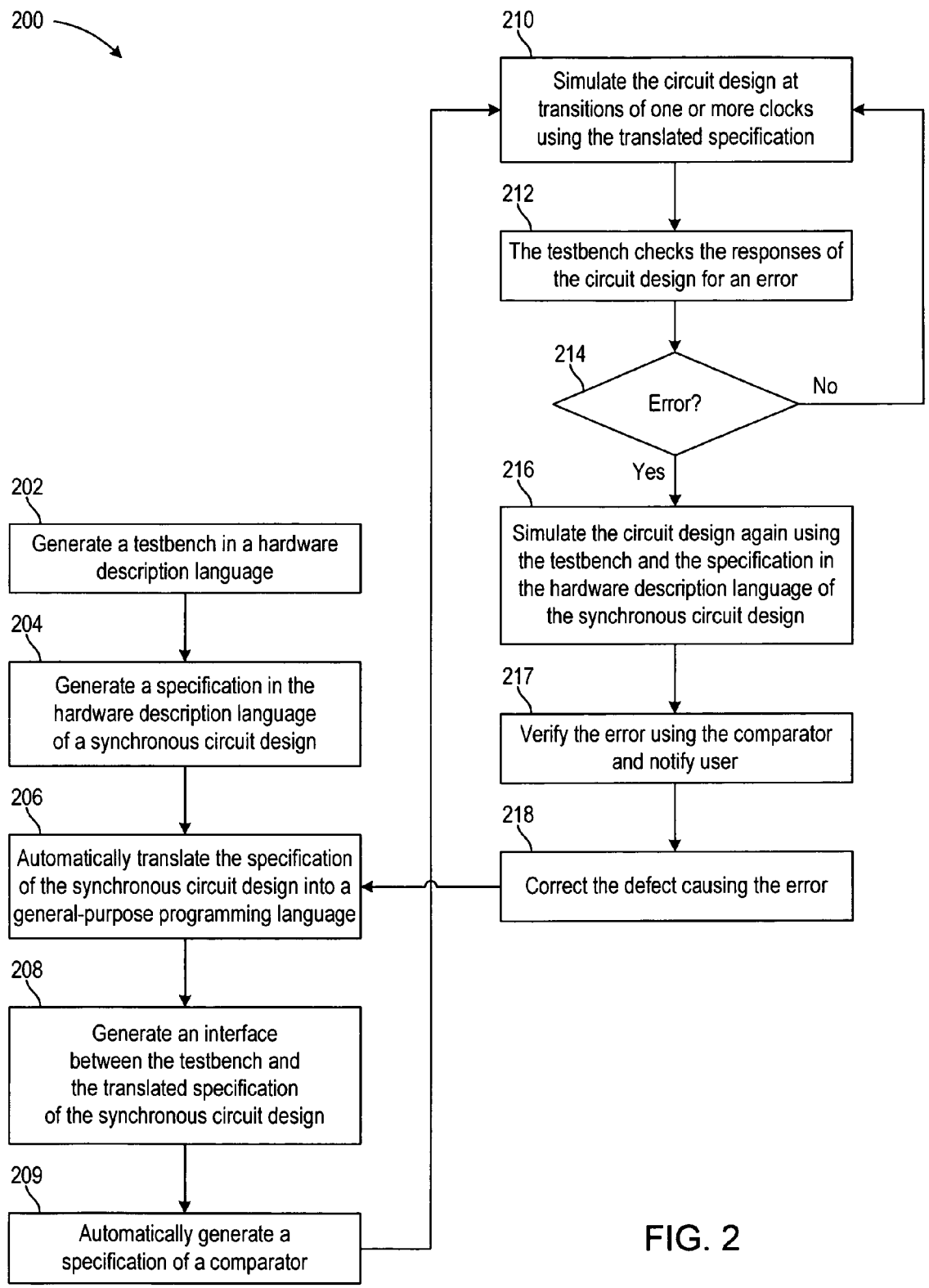
FIG. 2 is a flow diagram of a process for verifying a translation of a specification of a circuit design in accordance with various embodiments of the invention.

FIG. 2 is a flow diagram of a process 200 for verifying a translation of a specification of a circuit design in accordance with various embodiments of the invention. A specification in an HDL of the circuit design may be translated into a specification in a general purpose programming language of the behavior of the circuit design. The translated specification is used to simulate the circuit design and to check for errors, and for any errors the original specification in the HDL is used to simulate the circuit design again to check for reproduction of the error.

At step 202, a testbench is generated in an HDL for producing stimuli for one or more test scenarios for the circuit design. Frequently, the HDL testbench may also check for proper responses from the circuit design. At step 204, a specification of the circuit design is generated in the HDL. The circuit design is synchronous to one or more clock signals that may be specified in the HDL specification of the circuit design.

At step 206, the HDL specification of the circuit design is automatically translated into a specification of the behavior of the circuit design in a general purpose programming language. The translated specification may accurately model the behavior of the circuit design at transitions of the clock signal or clock signals.

At step 208, an interface is generated between the HDL testbench and the translated specification of the circuit design. In one embodiment, the interface may include a module in the HDL that invokes a function in the general purpose programming language via a programming language interface of a simulator for the HDL. The module in the HDL may invoke the function in the general purpose programming language at sensitized transitions of the clock signal or clock signals. The function in the general purpose programming language may invoke the translated specification of the circuit design and may also invoke conversion functions that convert between respective representations of signal values for the HDL and translated specifications of the circuit design.

At step 209, a specification of a comparator is automatically generated. The comparator may compare the behavior of a simulation of the translated specification with another simulation of the original specification of the circuit design, which is generated at step 204. The specification of the comparator may be in a scripting language, a high-level programming language, or in HDL, depending on implementation requirements.

At step 210, the behavior of the circuit design at clock transitions is simulated using the translated specification of the circuit design. At step 212, the HDL testbench checks for an error in the responses from the simulated circuit design. Errors may include a violation of a communication protocol, receiving an unexpected or incorrect transaction from the simulated circuit design, and/or not receiving an expected transaction from the simulated circuit design. When an error is detected, process 200 proceeds from decision 214 to step 216, and when no error is detected, process 200 returns to step 210 to simulate and check another test scenario. It will be appreciated that process 200 may complete when all test scenarios are successfully simulated without any errors on a translated specification of the circuit design.

At step 216, the circuit design is simulated again using the HDL testbench and the original specification of the circuit design in the HDL. The HDL testbench should generate the same stimuli for the circuit design, and if the translated specification correctly models the behavior of the original specification of the circuit design in the HDL, then the simulation should respond to the stimuli by repeating the error from the simulation at step 210.

At step 217, the comparator generated at step 209 compares the behaviors of the simulations at steps 210 and 216. For a difference in the behaviors, a user may be notified that the translated specification is an incorrect translation of the original specification.

At step 218, the defect causing the error is fixed and process 200 returns to step 206 for again translating the specification of the circuit design in the HDL into a specification of the behavior of the circuit design in the general purpose programming language. For a defect in the software that translates between the specifications in the HDL and the general purpose programming language, the defect in the translation software is corrected at step 218, and the corrected translation software is used on returning to step 206. For a defect in the specification of the circuit design in the HDL, including a defect caused by usage of elements of the HDL that are not supported by the translation software, the defect in the specification is corrected at step 218, and the corrected specification of the circuit design in the HDL is used on returning to step 206.

Figure 3:
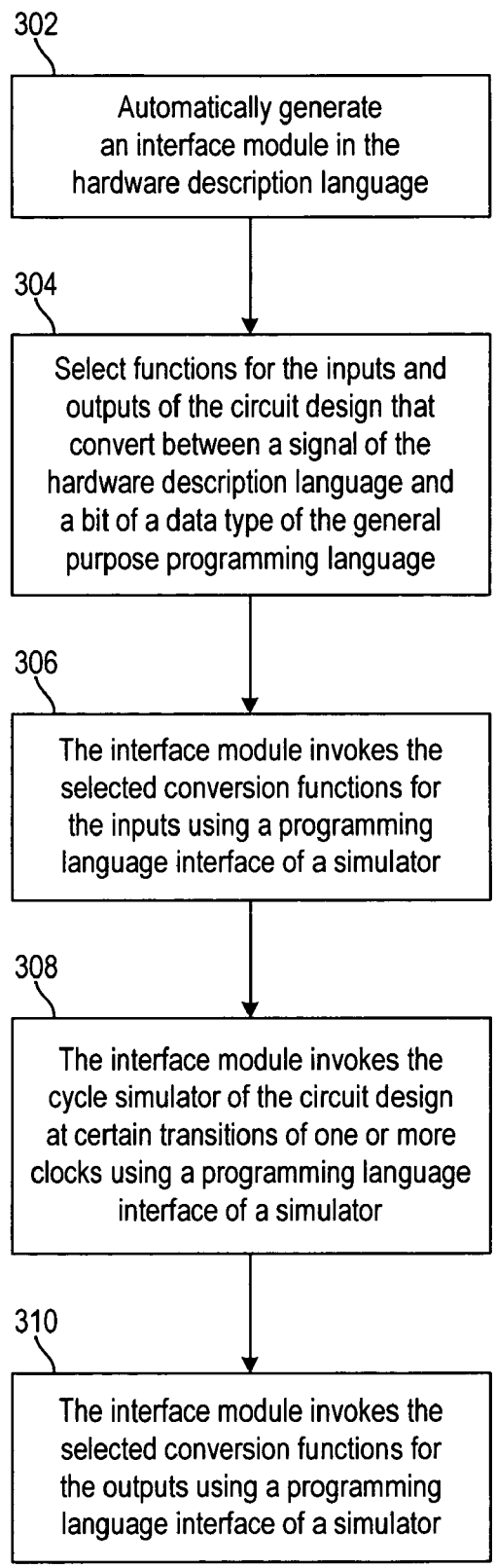
FIG. 3 is a flow diagram of a process for automatically generating an interface for a circuit design translated from a hardware description language to a general purpose programming language in accordance with various embodiments of the invention.

FIG. 3 is a flow diagram of a process for automatically generating an interface for a circuit design translated from a hardware description language to a general purpose programming language in accordance with various embodiments of the invention. The interface connects a testbench specified in an HDL with the translated specification of the circuit design in the general purpose programming language. The interface permits simulation of test cases using the translated specification and an unmodified version of the HDL testbench. The interface also converts between a representation in the HDL and a representation in the general purpose programming language for each input and output of the circuit design. Thus, the automatically generated interface permits faster simulation using the translated specification while eliminating manual writing of data conversion functions and also eliminating any modifications to the HDL testbench.

At step 302, an HDL interface module is automatically generated. The HDL interface module may include statements specifying the sensitivity of the circuit design to one or more clock signals. At step 304, conversion functions are generated for each input and output of the circuit design, or existing conversion functions are selected from a library. For each input of the circuit design, the corresponding conversion function converts from an HDL representation of the input signal to a bit of a data type of the general purpose programming language. For each output of the circuit design, the corresponding conversion function converts from a bit of a data type of the general purpose programming language to an HDL representation of the output signal.

At step 306, the interface module invokes the conversion functions for the inputs of the circuit design to convert the input signals from the HDL testbench into the representation used by the translated specification of the circuit design in the general purpose programming language. At step 308, the interface module invokes the translated specification of the circuit design. At step 310, the interface module invokes the conversion functions for the outputs of the circuit design to convert the output values from the translated specification of the circuit design into the representation used by the HDL testbench. For each of step 306, 308, and 310, the interface module may use a programming language interface of a simulator of the HDL to invoke the conversion functions and the translated specification at certain transitions of one or more clock signals.

An example circuit design in the HDL of SystemVerilog is outlined below in Example 1 for a FIFO that synchronizes between two synchronously-related clock domains.

EXAMPLE 1

```
module HDL_synchronizer (
    CLK, EXISTS0, DATA0, READ0,
    FULL1, DATA1, WRITE1 );
input      CLK, EXISTS0;
input      [31:0] DATA0;
output     READ0;
input      FULL1;
output     [31:0] DATA1;
output     WRITE1;
// Details of synchronizer implementation in SystemVerilog are omitted.
Endmodule
```

The automatically generated HDL interface module may have identical parameters to the HDL specification above and may also invoke an entry point function in the "C" general purpose programming language via a programming language interface. The HDL interface module, which is automatically generated from the HDL circuit design, is shown below in Example 2, which uses the Direct Programming Interface (DPI) of System Verilog. It will be appreciated that similar HDL interface modules may be automatically generated for the Programming Language Interface of Verilog IEEE 1364 and the Foreign Language Interface of ModelSim's VHDL simulator.

EXAMPLE 2

```
module HDL_interface (
    CLK, EXISTS0, DATA0, READ0,
    FULL1, DATA1, WRITE1 );
    input logic   CLK, EXISTS0;
    input logic   [31:0] DATA0;
    output logic  READ0;
    input logic   FULL1;
    output        logic [31:0] DATA1;
    output        logic WRITE1;
    // Declare programming language interface to C function
    import "DPI" context task C_function (
    input logic   CLK, EXISTS0,
    input logic   [31:0] DATA0,
    output logic  READ0,
    input logic   FULL1,
    output        logic [31:0] DATA1,
    output        logic WRITE1
    );
    // Invoke C function at sensitized transitions of a clock
       always @ (CLK )
       C_function (
         CLK, EXISTS0, DATA0, READ0,
         FULL1, DATA1, WRITE1 );
    Endmodule
```

The function in the general purpose programming language may invoke conversion functions and a cycle accurate model (CAM) that is the translated specification of the behavior of the HDL outlined above in Example 1. This function, which is automatically generated from the HDL circuit design, is shown below in Example 3.

EXAMPLE 3

```
int C_function (
    const svLogic              CLK, EXISTS0,
    const svLogicPackedArrRef  DATA0,
    svLogic                    *READ0,
    const svLogic              FULL1,
    svLogicPackedArrRef        DATA1,
    svLogic                    *WRITE1
)
    // Declare local variables for converted inputs and outputs
    unsigned char CLK_C, EXISTS0_C;
    unsigned int DATA0_C;
```

EXAMPLE 3-continued

```
    unsigned char READ0_C;
    unsigned char, FULL1_C;
    unsigned int DATA1_C;
    unsigned char WRITE1_C;
{
    // Convert the inputs of the circuit design
    CLK_C = convert_signal_to_C ( CLK );
    EXISTS0_C = convert_signal_to_C ( EXISTS0 );
    DATA0_C = convert_vector_to_C ( DATA0, 32 );
    FULL1_C = convert_signal_to_C ( FULL1 );
    // Invoke the cycle accurate model of the circuit design
    C_synchronizer (
            CLK_C, EXISTS0_C, DATA0_C, &READ0_C,
            FULL1_C, &DATA1_C, &WRITE1_C);
    // Convert the outputs of the circuit design
    *READ0 = convert_signal_from_C ( READ0_C );
    convert_vector_from_C ( DATA1, DATA1_C, 32 );
    *WRITE1 = convert_signal_from_C ( WRITE1_C );
    return ( 0 );
}
```

The conversion functions for the inputs and the outputs convert between data value representations in the HDL and the general purpose programming language. Each conversion function may be automatically generated or previously produced conversion function may automatically be selected from a library of conversion functions for various data value representations.

For the "C" or "C++" general purpose programming language, each HDL signal, including an array of signals within a signal vector, may be represented by a bit of an unsigned integer data type. Thus, signals and signal vectors that include at most 8 signals may be represented as an "unsigned char" data type. Signal vectors including more than 8 signals and at most 16 signals may be represented in most computer architectures as an "unsigned short" data type. Signal vectors including more than 16 and at most 32 signals may be represented in many computer architectures as an "unsigned int" data type. Signal vectors including more than 32 signals may be represented in certain computer architectures as either an "unsigned long" or an "unsigned long long" data type. For signal vectors including more signals than bits of the largest integer data type that is available, complex data types may be used, such as the XilBigUInt class available from Xilinx, Inc. for translating a Verilog or VHDL specification of a circuit design into a specification of the behavior the circuit design in the "C" programming language.

Figure 4:
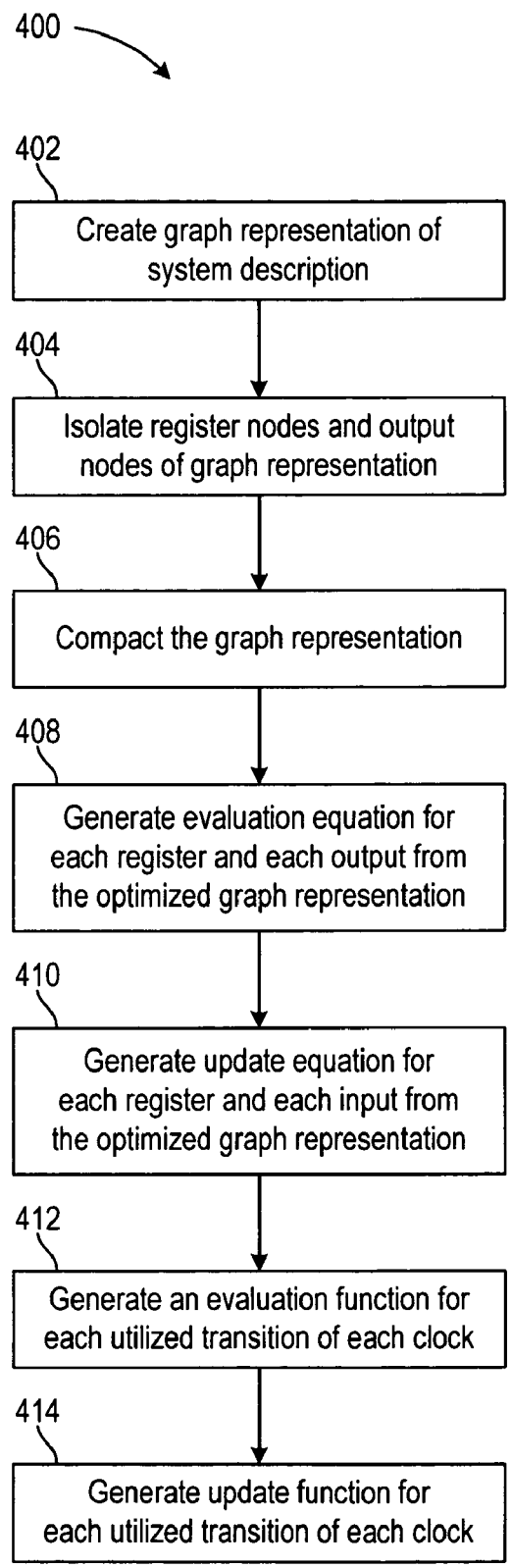
FIG. 4 is a flow diagram of a process for translating a circuit design from a hardware description language to a general purpose programming language in accordance with various embodiments of the invention.

FIG. 4 is a flow diagram of a process 400 for translating a circuit design from a hardware description language to a general purpose programming language in accordance with various embodiments of the invention. The circuit design may be a synchronous digital system described in a hardware description language (HDL), and this HDL description is the input to the process 400.

At step 402, the HDL description is parsed to generate a graph representation of the system. The graph representation may include nodes and edges, with nodes of various types for the blocks of the system and edges between nodes for the signal or signal vectors connecting the blocks. The graph representation may be a flattened representation that removes the structural hierarchy from the design.

The graph representation is analyzed at step 404 to isolate individual register nodes in the graph representation. Output nodes of the digital system are also isolated, although frequently the output nodes are already isolated before beginning graph analysis. During the isolation of register nodes, each node containing both a storage function and a combinational function may need to be split into a register node and a combinational node. For some HDLs, such as Verilog, registers may be inferred from behavioral descriptions during analysis of the graph representation.

At step 406, the combinational logic nodes are optimized to compact the graph representation. Heuristics may be used to compact the graph representation. The compaction optimization may include a sub-step similar to that used by a synthesis tool in generating a compact hardware implementation for the synchronous digital system. The compaction optimization may include a synthesis sub-step that may be used to generate a cycle accurate model, a hardware implementation, or both as the designer prefers.

At step 408, an evaluation equation is generated from the optimized graph representation for each register and each output isolated at step 404. For each clock cycle of a logic simulation, each evaluation equation may be evaluated to produce output values and register update values for the next clock cycle from the values for the registers and inputs for the current clock cycle.

At step 410 an update equation is generated for each input and each register. The update equation for a register updates the value of the register with the value from the evaluation equation for the register. The update equation for an input obtains a value of the input for the current clock cycle. An update equation may be generated for each register node and each of the nodes corresponding to the circuit functions of respective input functions. During the simulating of the behavior of the circuit design, the update equation for each register node updates the value of the corresponding register function for the next transition of the clock.

At step 412, an evaluation function is generated for each sensitized transition of each clock signal of the digital system. The evaluation function for a transition of a clock includes each of the evaluation equations generated at step 408 that are sensitized to the transition of the clock. For each sensitized transition of each clock signal, an update function is generated at step 414 that includes each of the update equations generated at step 410 that are sensitized to the transition of the clock. Each evaluation and update function may be associated with the transitions of the clock that are either rising transitions or falling transitions.

The cycle accurate model in the general purpose programming language for the digital system includes, for each sensitized transition of each clock, an invocation of the evaluate function for the transition of the clock followed by an invocation of the update function for the transition of the clock.

Figure 5:
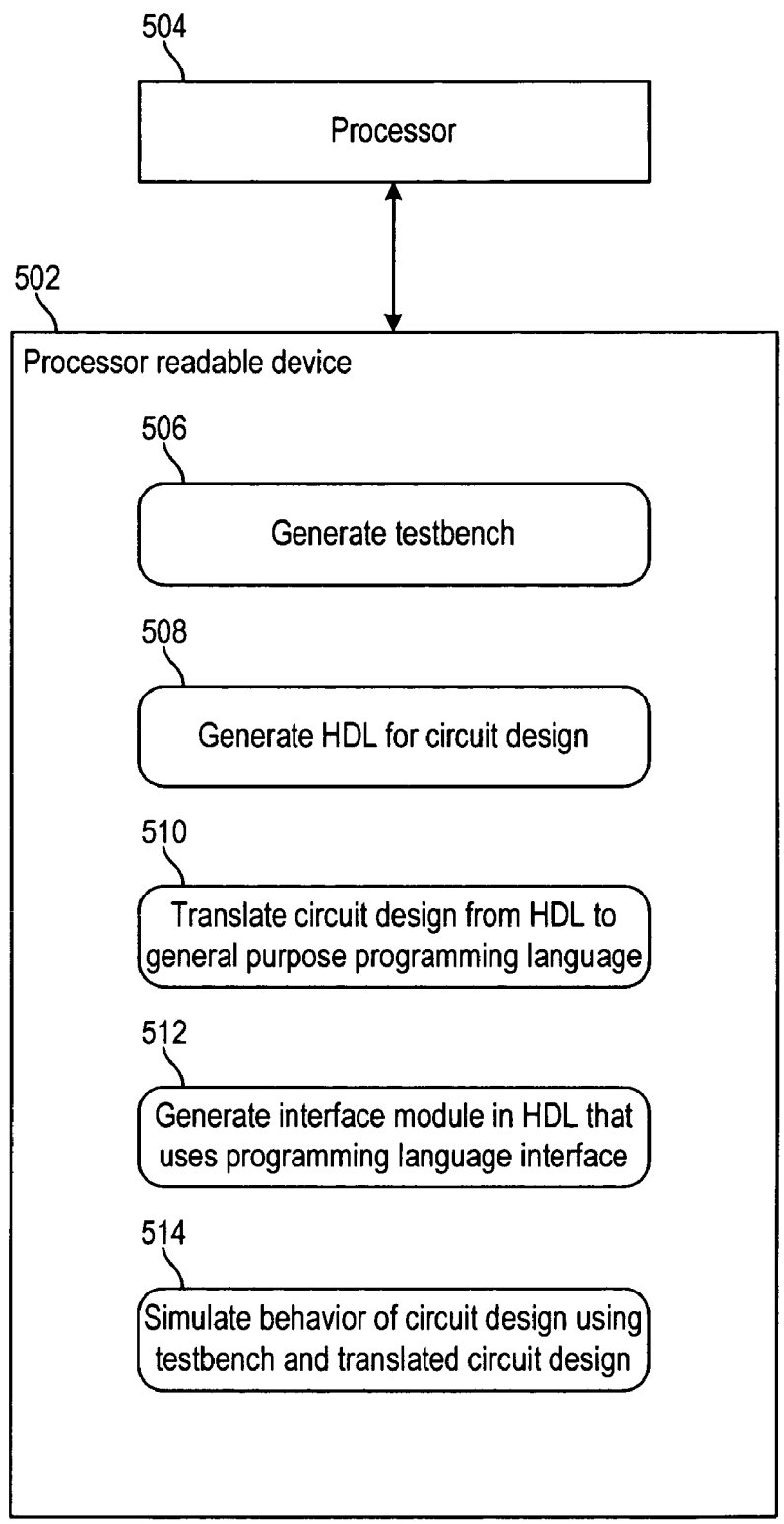
FIG. 5 is a block diagram illustrating a program storage medium in accordance with various embodiments of the invention.

FIG. 5 is a block diagram illustrating a program storage medium in accordance with various embodiments of the invention. A processor-readable device 502 is configured with instructions for simulating a circuit design, and execution of the instructions by processor 504 causes processor 504 to perform various operations. The instructions are included in software modules 506, 508, 510, 512 and 514.

Software module 506 is used to generate a specification of a testbench for generating stimuli applied to the circuit design. Software module 508 is used to generate a specification of the circuit design, which is synchronous to a clock signal or clock signals, in a hardware description language.

Software module 510 is used to automatically translate the specification of the circuit design into a specification in a general purpose programming language of a behavior of the circuit design. This translated specification specifies the behavior of the circuit design at transitions of the clock signal or clock signals. Software module 512 is used to automatically generate a specification of an interface between the testbench and the specification of the circuit design in the general purpose programming language.

Software module 514 is used to simulate the behavior of the circuit design responsive to the stimuli. This simulation uses the interface specification to link the testbench specification and the specification of the behavior of the circuit design in the general purpose programming language.

What is claimed is:

1. A processor-implemented method for simulating a circuit design, comprising:
   generating a first specification of a testbench in a hardware description language, wherein the testbench generates stimuli for application to the circuit design;
   generating a second specification of the circuit design in the hardware description language, wherein the circuit design is synchronous to at least one clock signal;
   automatically translating the second specification of the circuit design into a third specification in a general-purpose programming language, wherein the third specification specifies the behavior of the circuit design at transitions of the at least one clock signal;
   automatically generating a fourth specification of an interface between the first specification of the testbench in the hardware description language and the third specification of the circuit design in the general-purpose programming language; and
   simulating a first behavior of the circuit design responsive to the stimuli from the testbench using the first and third specifications linked by the fourth specification.

2. The method of claim 1, further comprising simulating a second behavior of the circuit design using the second specification and the stimuli from the testbench.

3. The method of claim 2, further comprising automatically generating a specification of a comparator that compares the first behavior to the second behavior.

4. The method of claim 3, further comprising determining whether a difference exists between the first behavior and the second behavior by the comparator.

5. The method of claim 4, further comprising notifying a user that the third specification is an incorrect translation of the second specification in response to a difference between the first behavior and the second behavior.

6. The method of claim 2, further comprising correcting the third specification in response to a difference between the first behavior and the second behavior.

7. The method of claim 6, wherein the correcting of the third specification includes modifying a software tool that performs the automatic translating of the second specification into the third specification and repeating automatically translating the second specification of the circuit design into the third specification in the general-purpose programming language of the first behavior of the circuit design using the software tool after the modifying of the software tool.

8. The method of claim 1, wherein the testbench checks responses obtained from the circuit design.

9. The method of claim 8, wherein the simulating of the first behavior of the circuit design responsive to the stimuli includes checking for presence of an error in the responses obtained from simulating the first behavior of the circuit design.

10. The method of claim 9, further comprising simulating a second behavior of the circuit design using the second specification and the stimuli from the test bench, and determining whether an error present in simulating the first behavior is also produced in simulating the second behavior.

11. The method of claim 1, wherein the automatically generating of the fourth specification includes automatically generating a module in the hardware description language that uses a programming language interface of a simulator to invoke the first behavior in the third specification of the circuit design.

12. The method of claim 11, wherein the automatically generating of the fourth specification further includes automatically selecting a plurality of conversion functions, wherein each conversion function converts between a respective first data representation of the hardware description language and a respective, corresponding second data representation of the general-purpose programming language.

13. The method of claim 12, wherein the second data representation that corresponds to the first data representation for a vector of the hardware description language is an integer of the general-purpose programming language, and the integer includes a respective bit for each of a plurality of signals of the vector.

14. The method of claim 11, wherein the automatically generating of the module includes specifying a sensitivity of the circuit design to the at least one clock signal.

15. The method of claim 1, wherein the hardware description language is at least one of a Verilog and a VHDL, and the general-purpose programming language is at least one of a C programming language and a C++ programming language.

16. The method of claim 1, wherein the automatically translating of the second specification into the third specification includes:
   creating a graph representation of the second specification of the circuit design, wherein the graph representation includes nodes and edges, each node representing a circuit function from the second specification, and each edge representing a signal flow between the circuit functions represented by two nodes;
   generating from the nodes of the graph representation, a plurality of register nodes corresponding to the circuit functions of respective register functions, wherein each respective register function is synchronous to one of the at least one clock; and
   generating a respective evaluation equation for each register node and each of the nodes corresponding to the circuit functions of respective output functions, wherein the evaluation equation for each register node produces a value of the respective register function for a next one of the transitions of the clock of the respective register function.

17. The method of claim 16 further comprising generating a respective update equation for each register node and each of the nodes corresponding to the circuit functions of respective input functions, wherein during the simulating of the first behavior of the circuit design, the update equation for each register node updates the value of the respective register function for the next transition of the clock of the respective register function.

18. The method of claim 17 further comprising:
   generating for each of the at least one clock at least one respective evaluation function, each evaluation function associated with the transitions of the clock that are one of rising and falling transitions, and each evaluation function including the evaluation equations for the transitions of the clock; and
   generating for each of the at least one clock at least one respective update function, each update function associated with the transitions of the clock that are one of rising and falling transitions, and each update function including the update equations for the transitions of the clock.

19. An article of manufacture, comprising:

a processor-readable device configured with instructions for simulating a circuit design, wherein execution of the instructions by one or more processors causes the one or more processors to perform operations including, generating a first specification of a testbench in a hardware description language, wherein the testbench generates stimuli for application to the circuit design;

generating a second specification of the circuit design in the hardware description language, wherein the circuit design is synchronous to at least one clock signal;

automatically translating the second specification of the circuit design into a third specification in a general-purpose programming language, wherein the third specification specifies the behavior of the circuit design at transitions of the at least one clock signal;

automatically generating a fourth specification of an interface between the first specification of the testbench in the hardware description language and the third specification of the circuit design in the general-purpose programming language; and simulating a first behavior of the circuit design responsive to the stimuli from the testbench using the first and third specifications linked by the fourth specification.

20. A simulator of a circuit design, comprising:

means for generating a first specification of a testbench in a hardware description language, wherein the testbench generates stimuli for application to the circuit design;

means for generating a second specification of the circuit design in the hardware description language, wherein the circuit design is synchronous to at least one clock signal;

means for automatically translating the second specification of the circuit design into a third specification in a general-purpose programming language, wherein the third specification specifies the behavior of the circuit design at transitions of the at least one clock signal;

means for automatically generating a fourth specification of an interface between the first specification of the testbench in the hardware description language and the third specification of the circuit design in the general-purpose programming language; and means for simulating a first behavior of the circuit design responsive to the stimuli from the testbench using the first and third specifications linked by the fourth specification.

* * * * *